United States Patent
Li et al.

(10) Patent No.: US 9,224,687 B2
(45) Date of Patent: Dec. 29, 2015

(54) PROGRAMMABLE FUSE STRUCTURE AND METHODS OF FORMING

(71) Applicant: International Business Machines Corporation, Armonk, NY (US)

(72) Inventors: Yan Zun Li, Lagrangeville, NY (US); Zhengwen Li, Danbury, CT (US); Chengwen Pei, Danbury, CT (US); Jian Yu, Danbury, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/478,636

(22) Filed: Sep. 5, 2014

(65) Prior Publication Data

US 2014/0374874 A1    Dec. 25, 2014

Related U.S. Application Data

(62) Division of application No. 13/419,877, filed on Mar. 14, 2012, now Pat. No. 8,981,523.

(51) Int. Cl.
*H01L 23/52* (2006.01)
*H01L 29/06* (2006.01)
*H01L 23/525* (2006.01)
(Continued)

(52) U.S. Cl.
CPC ...... *H01L 23/5256* (2013.01); *H01L 23/53204* (2013.01); *H01L 27/115* (2013.01); *H01L 2924/0002* (2013.01)

(58) Field of Classification Search
CPC ............ H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66
USPC ......... 438/136, 137, 156, 173, 192, 206, 212, 438/424, 427, 428, 591; 257/20, 194, 257/135–136, 213–413, 900, 902–903
See application file for complete search history.

(56) References Cited

U.S. PATENT DOCUMENTS

| | | | |
|---|---|---|---|
| 6,661,330 | B1 | 12/2003 | Young |
| 6,707,106 | B1 | 3/2004 | Wristers et al. |
| 7,205,631 | B2 | 4/2007 | Dondero et al. |

(Continued)

FOREIGN PATENT DOCUMENTS

CN    1905084 A    1/2007

OTHER PUBLICATIONS

U.S. Appl. No. 13/419,877, Notice of Allowance, dated Nov. 5, 2014, 10 pages.

(Continued)

*Primary Examiner* — Selim Ahmed
*Assistant Examiner* — Moin Rahman
(74) *Attorney, Agent, or Firm* — Yuanmin Cai; Hoffman Warnick LLC

(57) ABSTRACT

Methods of forming an electrically programmable fuse (e-fuse) structure and the e-fuse structure are disclosed. One embodiment of an e-fuse structure includes: a silicon structure; a pair of silicide contact regions overlying the silicon structure; and a silicide link overlying the silicon structure and connecting the pair of silicide regions, the silicide link having a depth less than a depth of each of the pair of silicide contact regions.

12 Claims, 10 Drawing Sheets

Cut along A-A'

(51) Int. Cl.
*H01L 27/115* (2006.01)
*H01L 23/532* (2006.01)

(56) References Cited

U.S. PATENT DOCUMENTS

| | | | |
|---|---|---|---|
| 7,479,689 B2 | 1/2009 | Kim et al. | |
| 7,777,296 B2 | 8/2010 | Yang et al. | |
| 7,820,492 B2 | 10/2010 | Miyashita et al. | |
| 7,888,771 B1 | 2/2011 | Sidhu et al. | |
| 2007/0131930 A1 | 6/2007 | Aida et al. | |
| 2007/0252237 A1* | 11/2007 | Ko et al. | 257/529 |
| 2008/0179706 A1* | 7/2008 | Kim et al. | H01L 23/5256 257/529 |
| 2009/0051002 A1 | 2/2009 | Booth et al. | |
| 2009/0224323 A1 | 9/2009 | Im et al. | |
| 2009/0283853 A1 | 11/2009 | Huebinger | |
| 2011/0012629 A1 | 1/2011 | Chakravarti et al. | |
| 2011/0198675 A1 | 8/2011 | Ng et al. | |
| 2012/0129312 A1* | 5/2012 | Utomo et al. | 438/381 |
| 2012/0235244 A1 | 9/2012 | Yin et al. | |
| 2013/0082347 A1 | 4/2013 | Chen et al. | |

OTHER PUBLICATIONS

U.S. Appl. No. 13/419,877, Office Action dated Jul. 2, 2013.
U.S. Appl. No. 13/419,877, Office Action dated Jan. 8, 2014.
U.S. Appl. No. 13/419,877, Office Action dated Jul. 18, 2014.

* cited by examiner

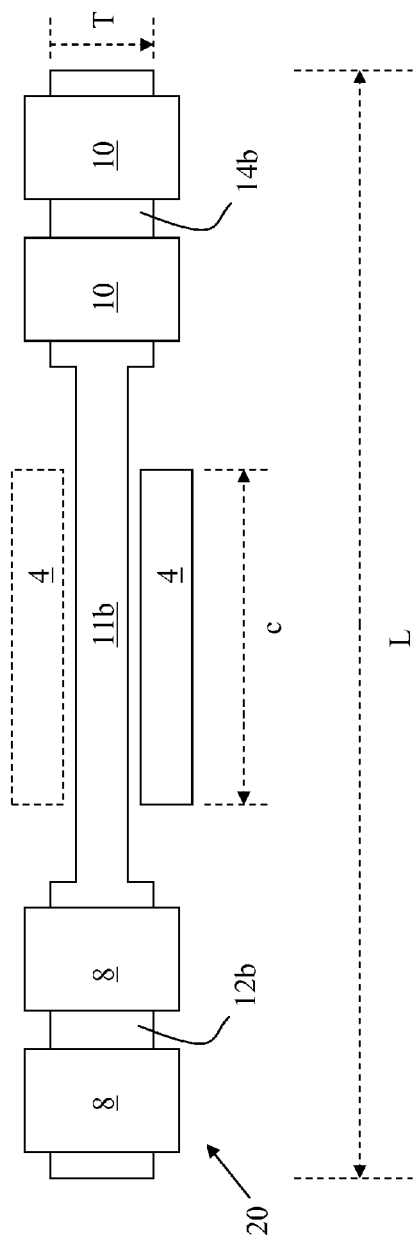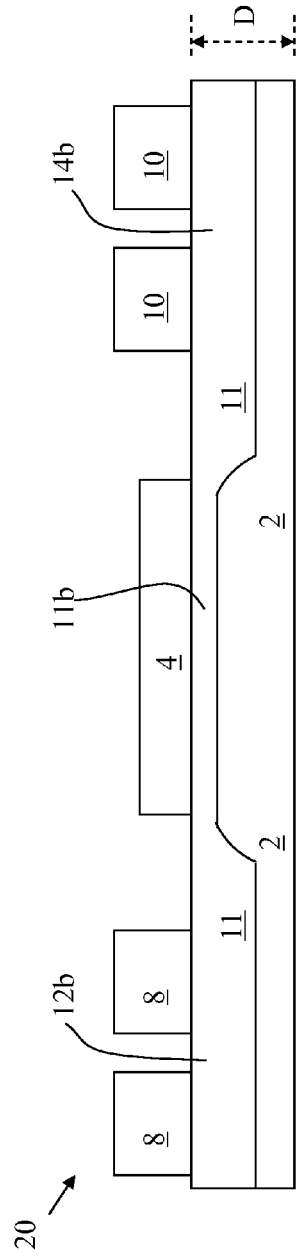
FIG. 9
FIG. 10

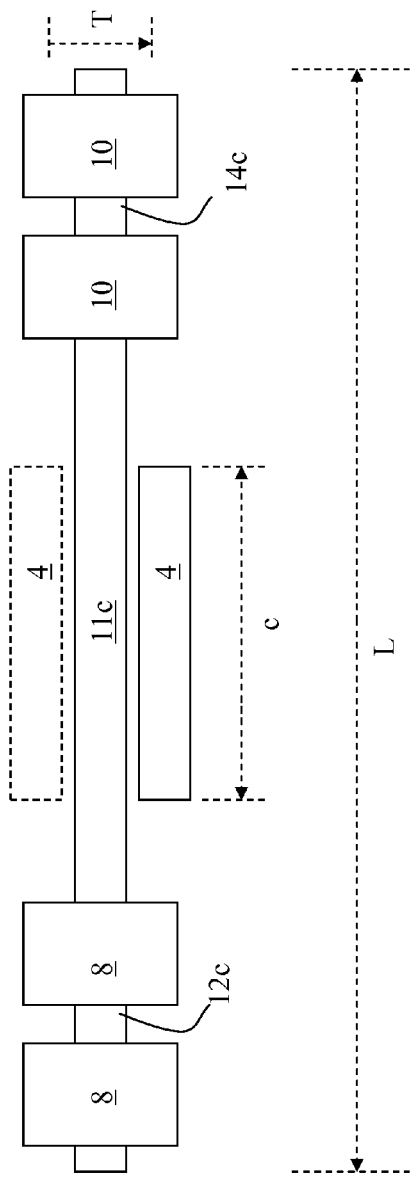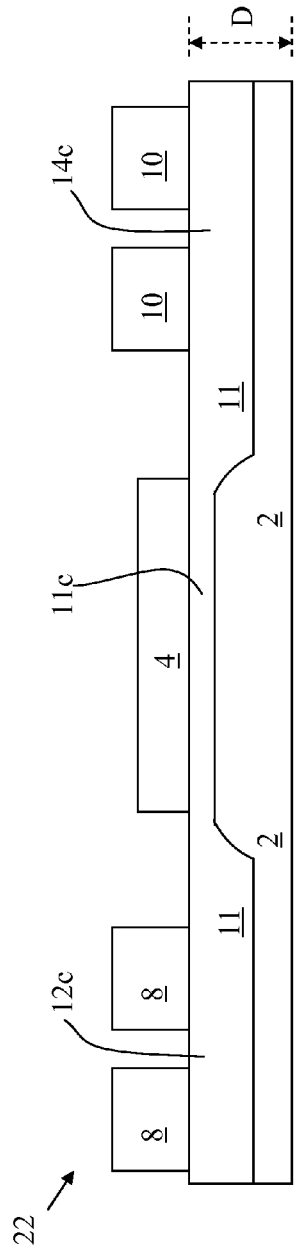
FIG. 11
FIG. 12

PROGRAMMABLE FUSE STRUCTURE AND METHODS OF FORMING

FIELD

The subject matter disclosed herein relates to fuses. More specifically, various aspects described herein relate to a method of forming a programmable fuse and the fuse structure formed thereby.

BACKGROUND

Electrically programmable fuses (or, e-fuses) are conventionally integrated into a semiconductor integrated circuit (IC) as a link (or, strip) of conducting material (e.g. metal, poly-silicon, etc.) between a respective anode and cathode access pads. The resistance of the fuse is initially low, and commonly referred to as "closed" in a circuit. When a sufficiently large current ($I_{fuse}$) is applied between the anode and cathode, the metallic elements in the link are electrically migrated away or the link is thermally destroyed, thereby changing the resistance of the e-fuse to a much higher level, commonly referred to as "open" in a circuit. This technique is commonly referred to as programming the e-fuse. Determining whether the fuse has been programmed is conventionally performed using a separate sensing circuit.

Forming reliable e-fuses at low costs is a difficult task. One common issue with forming e-fuses is limited programming yield, which can result in product yield losses or the use of costly error correction code solutions. Additionally, latent programming damage can further reduce product yield, e.g., cause product failures in later stages of the manufacturing process or cause product failure during field service. Even further, e-fuses with high programming current and/or high programming voltages can be costly to integrate into products.

BRIEF SUMMARY

Methods of forming an electrically programmable fuse (e-fuse) structure and the e-fuse structure are disclosed. Various embodiments of forming the e-fuse structure include the following processes: forming a dummy poly gate structure contacting a surface of a silicon structure, the dummy poly gate structure extending only part of a length of the silicon structure; and converting an unobstructed portion of the surface of the silicon structure to silicide to form a thinned strip of the silicide between two end regions.

A first aspect includes a method of forming an electrically programmable fuse, the method including: forming a dummy poly gate structure to contact a surface of a silicon structure, the dummy poly gate structure extending only a part of a length of the silicon structure; and converting an unobstructed portion of the surface of the silicon structure to silicide to form a thinned strip of the silicide between two end regions.

A second aspect includes an electrically programmable fuse (e-fuse) having: a silicon structure; a pair of silicide contact regions overlying the silicon structure; and a silicide link overlying the silicon structure and connecting the pair of silicide regions, the silicide link having a depth less than a depth of each of the pair of silicide contact regions.

A third aspect includes a method of forming an electrically programmable fuse, the method including: forming a pair of substantially equilateral parallel dummy poly gate structures at the edges of and parallel to a defined silicon structure, the pair of substantially equilateral parallel dummy gate structures extending only part of a length of the silicon structure; and forming contacts to the silicon structure at each end, e.g., anode and cathode, with metal wires on top of the contacts. The desired properties of the fuse are achieved through the proper design of the dummy poly gate structures, e.g., a desired local high resistance region in the fuse link that helps fuse programming at desired location with reduced current requirement.

A fourth aspect includes an electrically programmable fuse (e-fuse) having: a silicon structure; a pair of silicide contact regions overlying the silicon structure, the pair of silicide contact regions including an anode contact and a cathode contact; and a silicide link overlying the silicon structure and connecting the pair of silicide regions, the silicide link having a depth less than a depth of each of the pair of silicide contact regions, wherein the silicide link further has a width less than a width of the pair of silicide contact regions.

A fifth aspect includes an electrically programmable fuse (e-fuse) having: a silicon structure; a pair of silicide contact regions overlying the silicon structure, the pair of silicide contact regions including an anode contact and a cathode contact; a silicide link overlying the silicon structure and connecting the pair of silicide regions, the silicide link having a depth less than a depth of each of the pair of silicide contact regions, wherein the silicide link has an equal length as the pair of silicide contact regions; and a pair of dummy poly gates overlying the silicon structure each on opposing sides of the silicide link and separated from the silicide link by the silicon structure.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 9 shows a plan view of an e-fuse structure according to embodiments.

FIG. 10 shows a side cross-sectional view of the e-fuse structure of FIG. 9 according to embodiments.

FIG. 11 shows a plan view of an e-fuse structure according to embodiments.

FIG. 12 shows a side cross-sectional view of the e-fuse structure of FIG. 11 according to embodiments.

Figure 1A:
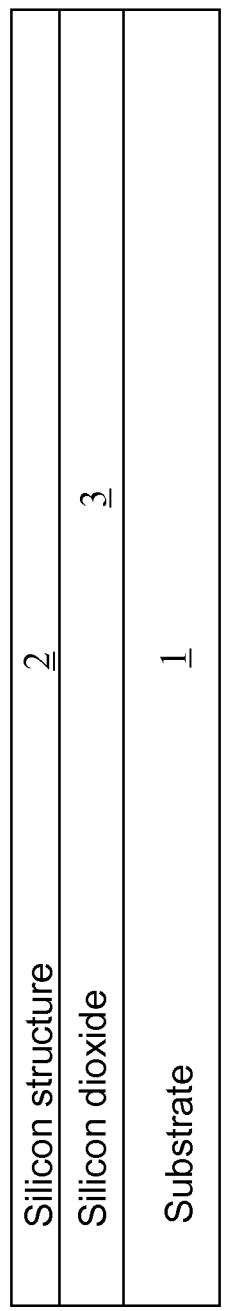
FIGS. 1A and 1B show side cross-sectional views of a semiconductor precursor structure according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

The subject matter disclosed herein relates to fuses. More specifically, various aspects described herein relate to a method of forming a programmable fuse and the fuse structure formed thereby.

Various embodiments of the invention include a method of forming an electrically programmable fuse (e-fuse) having improved yield and reliability with a lower required programming current when compared with conventional e-fuses. As described further herein, many aspects of the invention utilize one or more dummy poly gate structures to modify silicide formation in a defined silicon structure to form a thinned silicide (e.g., in depth or width) link between the fuse anode and cathode. In some cases, a method includes: forming a dummy poly gate structure to contact a surface of a silicon structure, the dummy poly gate structure extending only a part of a length of the silicon structure. In this case, the term "to contact" can mean simply to physically touch, nearly physically touch, or come into contact with, and not necessarily electrically contact. That is, the dummy poly gate structure can touch a surface of the silicon structure without providing any electrical connection between the two structures. In any case, after forming of the dummy poly gate structure(s) to contact (touch) a surface of the silicon structure, the method can include converting an unobstructed portion of the surface of the silicon structure to silicide to form a thinned strip of the silicide between two end regions. The reduced width of formed silicide can be a result of several contributing factors, namely the area of exposed silicon in the silicon structure, the metal deposition technique (e.g., conformality of film), loading effect (e.g., pattern density), etc.

Various other embodiments include an electrically programmable fuse (e-fuse) which may be formed according to one or more of the methods described herein. In some cases, an e-fuse is disclosed having: a silicon structure; a pair of silicide contact regions overlying the silicon structure; and a silicide link overlying the silicon structure and connecting the pair of silicide regions. The silicide link has a depth less than a depth of each of the pair of silicide contact regions.

Figure 1B:
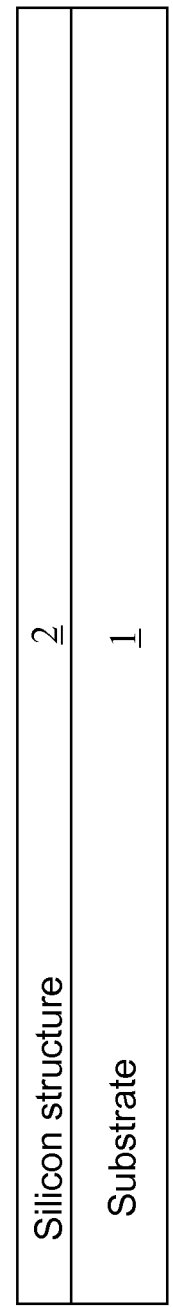

Turning to FIGS. 1A and 1B, respectively, side cross-sectional views of a silicon structure 2 overlying a substrate 1 shown. FIGS. 1A and 1B show alternative embodiments where the silicon structure 2 is part of a silicon-on-insulator, or SOI substrate (FIG. 1A), or is simply formed over a single substrate layer 1 (FIG. 1B). In some cases, the substrate 1 can include semiconductor materials such as silicon germanium, silicon carbide, etc. In some cases, the silicon structure 2 can be formed of a substantially similar material as the substrate 1. In some cases, both the silicon structure 2 and the substrate 1 can be formed substantially of silicon. In other cases, the substrate 1 can include any conventional substrate materials such as germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In the example of the SOI substrate (shown in FIG. 1A), the substrate 1 can be non-conductive material such as sapphire, etc.

Figure 2:
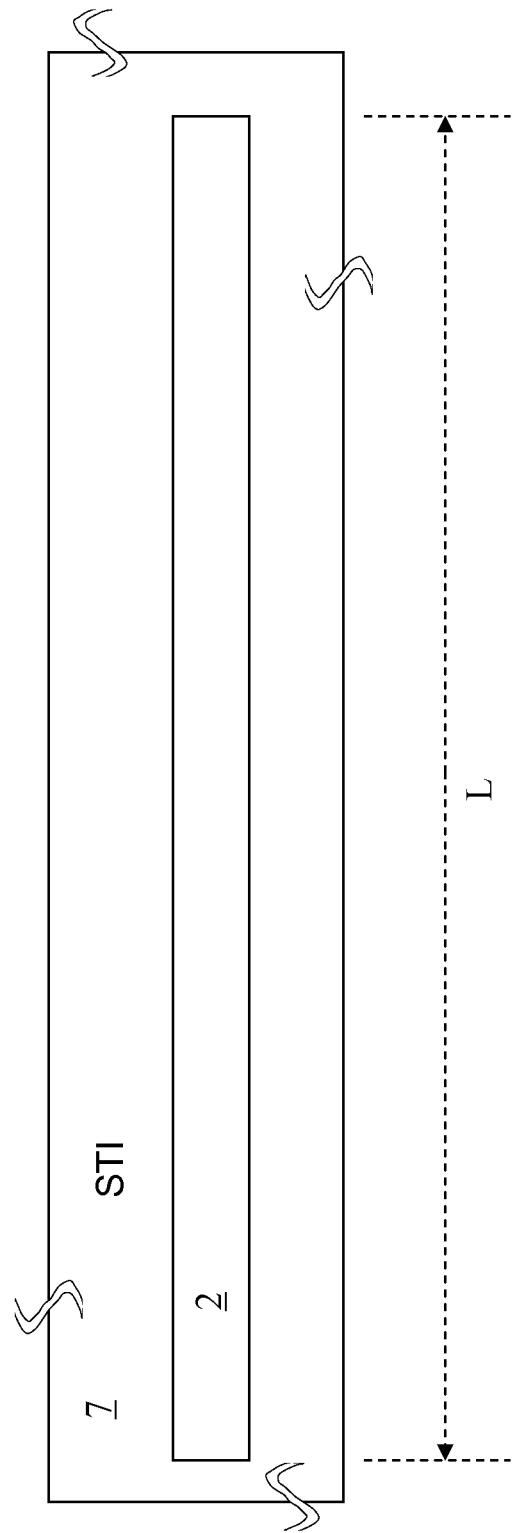
FIG. 2 shows a plan view of a semiconductor precursor structure according to embodiments.

FIG. 2 shows a top view of a precursor semiconductor device which includes the silicon structure 2 surrounded by one or more shallow trench isolation(s) 7. As with the embodiments shown and described with reference to FIGS. 1A and 1B, the silicon structure can overly a substrate 1, and in some embodiments, a substrate 1 and a silicon dioxide layer 3.

Figure 3:
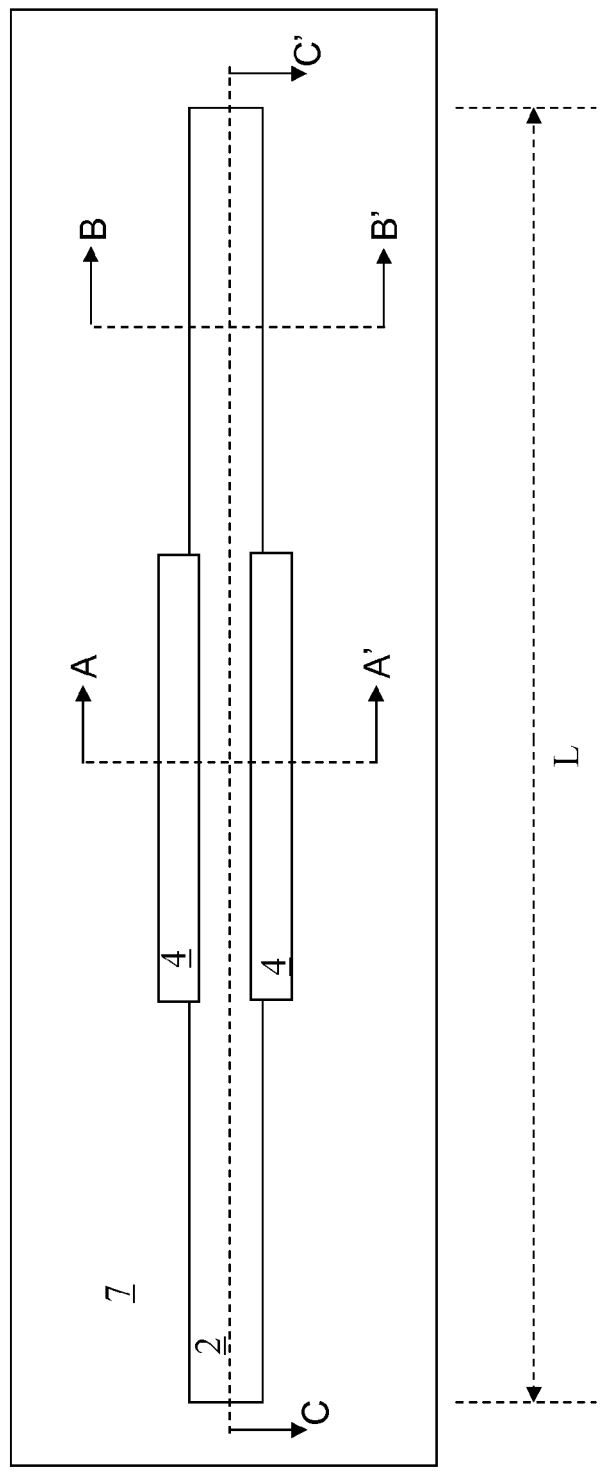
FIG. 3 shows a plan view of the semiconductor structure of FIG. 2 after a processing step performed according to embodiments.

FIG. 3 illustrates a portion of a process according to various embodiments of the invention. As shown, a dummy poly gate structure 4 is formed to contact a surface the silicon structure 2, and in some cases is formed over a middle portion of the silicon structure along its length L. In some cases, a pair of dummy poly gate structures 4 can be formed over the silicon structure (the second poly gate structure 4 obscured from view in this page by the first poly gate structure 4). As noted herein, in some cases, only one dummy poly gate structure 4 is formed over the silicon structure 2, which is indicated by the phantom dummy poly gate structure 4 denoted in the remaining Figures. It is understood that in some cases, the term "dummy poly gate structure" can refer to a non-conducting structure formed as a conventional gate, but made of a polysilicon or other comparable material.

Following formation of the dummy poly gate structures 4 contacting a surface of the silicon structure 2, the process can further include forming a precursor metal over the unobstructed surface of the silicon structure 2 (as well as over a portion of the dummy poly gate structures 4) and annealing to convert that precursor metal to a silicide.

Figure 4:
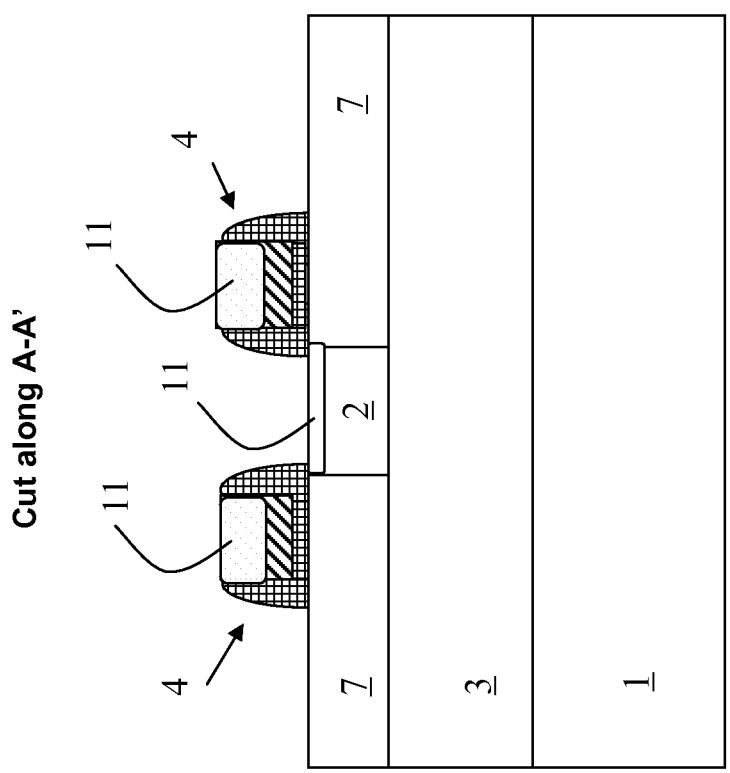
FIGS. 4-6 show respective side cross-sectional views of a semiconductor structure according to embodiments.
Figure 5:
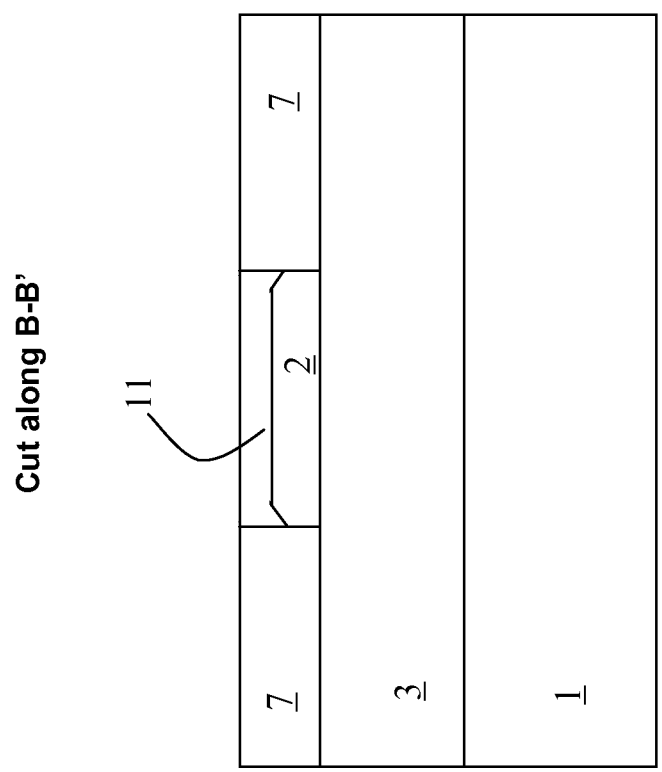
Figure 6:
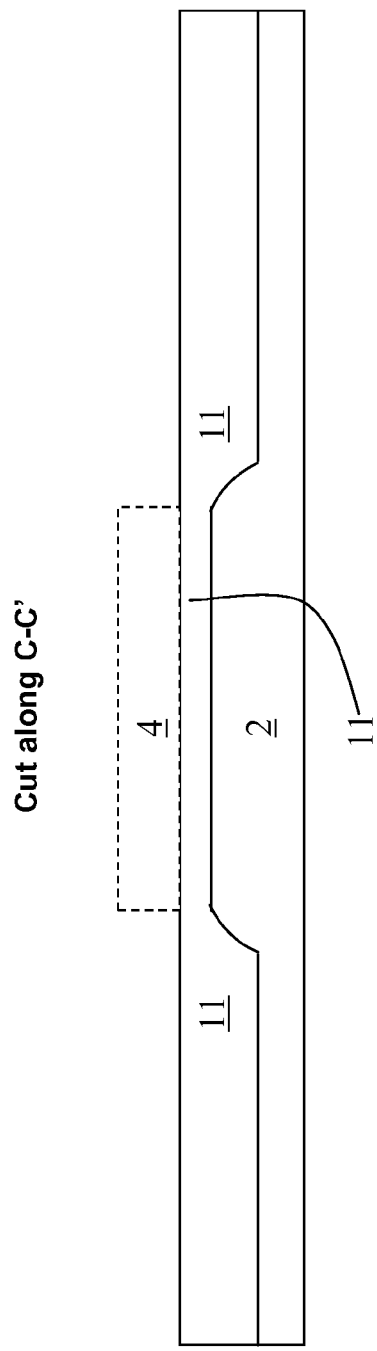

FIGS. 4-6 show respective cross-sectional views (along lines A-A', B-B' and C-C') of the precursor structure of FIG. 3 after depositing of a silicide precursor metal over the unobstructed surface of the silicon structure 2 (as well as over the adjacent dummy poly gate structure(s) 4, and subsequent annealing. In some cases, the silicide precursor metal can include nickel. The silicide precursor metal can be deposited in any conventional manner, and can be either isotropic or anisotropic. In some cases, the silicide precursor metal is deposited over both of the dummy poly gate structures 4 as well as the silicon structure 2. The resulting silicide 11 is shown formed in the silicon structure 2 and in a portion of the dummy poly gate structure(s) 4.

As noted herein, a conventional annealing process can be used to heat the silicide precursor metal and portions of the underlying silicon structure 2, allowing for material transformation between the two layers. This annealing causes the unobstructed portions of the underlying silicon structure 2 to become silicide 11, that is, to take on some of the metallic/conductive properties of the overlying silicide precursor metal. It is understood that the dummy poly gate structure 4 can be substantially unaffected by the annealing process, and as such, will remain substantially in tact after annealing. The term "unobstructed" is used to refer to those portions of the substrate 2 which are converted to silicide 11 during the annealing process. It is understood that portions of the substrate 2 will not be converted to silicide due to their proximity to a dummy poly gate structure 4. That is, various embodiments employ the dummy poly gate structure 4 to block or reduce silicide 11 formation in portions of the substrate 2. As the dummy poly gate structure(s) 4 can block or prevent substantial silicide formation, they can prevent some underlying portions of the substrate 2 from converting to silicide 11 as well.

After annealing to form a silicide 11 (shown in FIGS. 4-6), the silicide precursor metal can be removed via a conventional washing technique, e.g., an aqua regia bath. After removal of the silicide precursor metal, the dummy poly gate structures 4 remain substantially in place.

FIG. 6 shows a resulting silicide layer (or, silicide) 11 in a side cross-sectional view, where the formation of silicide 11 in the substrate layer 2 is non-uniform due to the presence of the dummy poly gate structure(s) 4 (in obstructing formation of silicide 11). As described herein, the dummy poly gate structure(s) 4 are utilized according to various embodiments to create a silicide profile in the substrate layer 2, thereby thinning a portion of the subsequently formed silicide 11. This thinned portion of the silicide 11 will have a greater resistance than the thicker silicide regions near a subsequently formed anode and cathode (further described herein).

Figure 7:
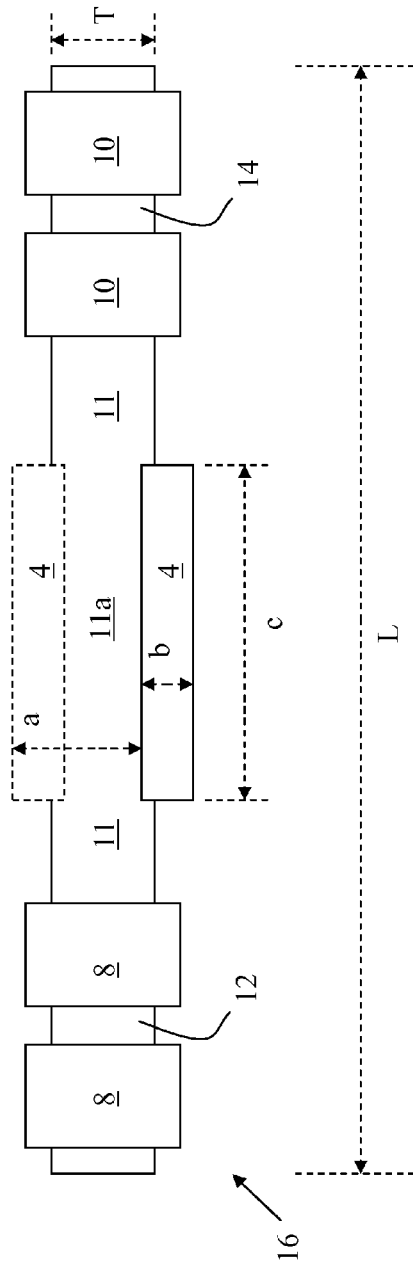
FIG. 7 shows a plan view of an electrically programmable fuse (e-fuse) structure according to embodiments.

FIG. 7 illustrates a plan view of an e-fuse structure, which is a progression of the structure shown in FIGS. 4-6 after formation of an anode contact 8 and a cathode contact 10, respectively, over the silicide 11. The anode contact 8 and cathode contact 10 can be formed of any conductive material (e.g., a metal) and can enable current to pass through the e-fuse 16, for example, to program the e-fuse 11. The conductive material used to form the anode contact 8 and/or the cathode contact 10 can be formed over the silicide 11 via any conventional approaches, e.g., deposition, masking, etching, sputtering and/or epitaxial growth. The anode contact 8 and cathode contact 10 are formed over respective silicide contact regions 12 and 14 on opposite ends of the structure. As will be described further herein, these silicide contact regions 12 and 14 can each have a depth (into the page) and/or a width greater than the silicide 11 in a central portion of the structure (proximate dummy poly structure(s)) 4. In FIGS. 7-12, the thinned silicide regions are called silicide "links" or simply "thinned silicide regions", and are labeled as 11a, 11b or 11c to indicate that these regions include silicide, but have a width less than the silicide 11 regions proximate the anode contact 8 and/or cathode contact 10.

Figure 8:
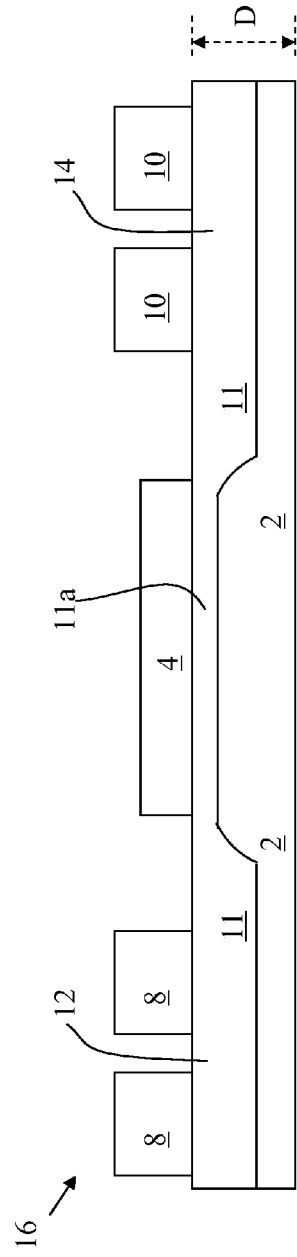
FIG. 8 shows a side cross-sectional view of the e-fuse structure of FIG. 7 according to embodiments.

FIG. 8 shows a side cross-sectional view of the e-fuse structure 16 of FIG. 7. As shown, the e-fuse structure 16 includes a silicon structure 2, a pair of silicide contact regions 12 and 14 overlying the silicon structure (substrate 2), and a silicide link 11a overlying the substrate 2 and connecting the pair for silicide contact regions 12, 14. The silicide link 11a has a depth (D) less than the depth of each of the pair of silicide contact regions 14, and in some cases, can have a width (T) less than a width of the pair of silicide contact regions 14. With continuing reference to FIGS. 7-8, it is understood that the width (T), depth (D) and length (L) of the silicide link 11a can be modified to desired dimensions in order to modify a resistance of the silicide link relative to the remainder of the silicide layer (e.g., the silicide contact regions 12 and 14). As shown in FIG. 7, dimensions such as dummy poly gate pitch (a), width (b) and length (c) of one or more dummy poly gate(s) 4 can be modified in order to yield a desired width (T), depth (D) and length (L) of the silicide link 11a in the e-fuse structure 16.

FIGS. 9-10 show an alternative embodiment of the e-fuse structure 16 of FIGS. 7-8, where the defined silicon structure is narrower in the central link 11b region when compared with these other embodiments. With the reduced depth (D) (FIG. 10) of the silicide link 11b between the silicide contact regions 12 and 14, this embodiment has a smaller volume of mass than the embodiment shown and described with reference to FIGS. 7-8, and as such, requires less programming current to program the fuse. In this case, the silicide link 11b is formed spaced from the dummy poly gates 4, and the dummy poly gates 4 further impede silicide formation in the substrate 2 along their perimeters. Here, the silicide contact regions 12b, 14b are thicker than the silicide link 11b, similar to the embodiment shown and described in FIGS. 7-8. The e-fuse structure 20 is shown in cross-sectional form in FIG. 10.

FIG. 11 shows an alternative embodiment of the e-fuse structure of FIGS. 8 and 10, where the defined silicon structure is a relatively narrow, straight structure, as compared to other embodiments described herein, and the dummy poly gates 4 are used to define the length (L) and reduce the depth (D) (FIG. 12) of the silicide link 11c between the silicide contact regions 12c and 14c. In this case, the silicide link 11c is formed spaced from the dummy poly gates 4, and the dummy poly gates 4 further impede silicide formation in the substrate 2 along their perimeters. Here, the silicide contact regions 12c, 14c have an equal length as the silicide link 11c, similar to the embodiment shown and described in FIGS. 9-10. The e-fuse structure 22 is shown in cross-sectional form in FIG. 12. With this further reduced mass in the anode and cathode contact regions 12c and 14c, this embodiment further reduces the current needed to program the fuse.

Figure 13:
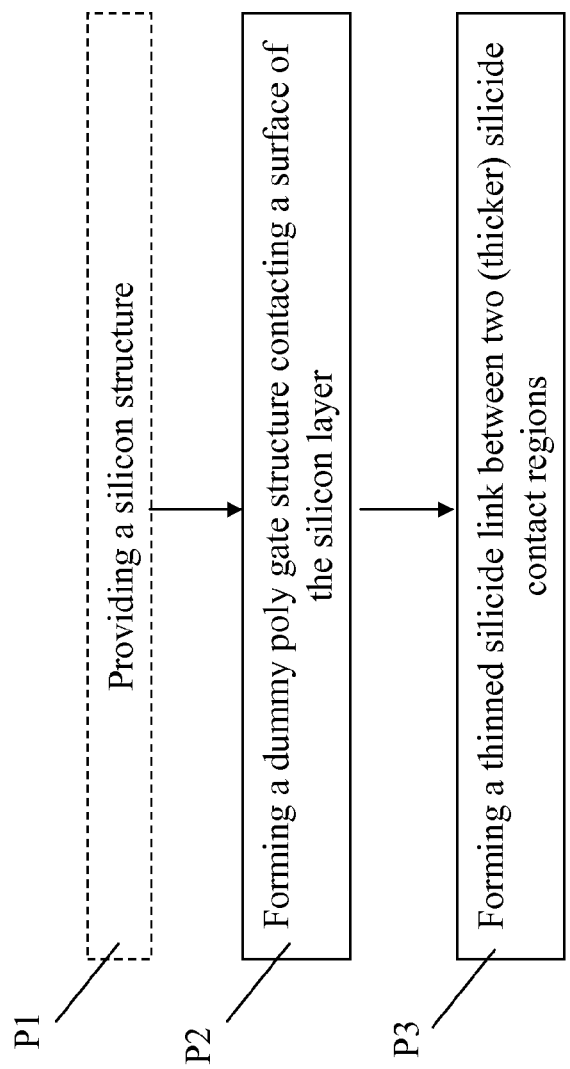
FIG. 13 is an illustrative flow diagram outlining processes performed according to various embodiments.

FIG. 13 is an illustrative flow diagram outlining processes performed according to various embodiments of the invention. As shown, one method can include the following processes:

Process P1: providing a silicon structure 2. This process is shown in phantom, and can be an optional pre-process according to various aspects.

Process P2: following process P1, this process can include forming a dummy poly gate (e.g., dummy poly gate(s) 4) over the silicon structure (e.g., substrate).

Process P3: following process P2, this process can include converting an unobstructed portion of the surface of the silicon structure to silicide to form a thinned silicide link between two (thicker) silicide contact regions (e.g., including an anode and cathode, respectively).

It is understood that these are merely illustrative processes which can be performed in conjunction with one another, or with other processes described herein.

In any case, as described herein, various aspects of the invention enable the formation of improved e-fuses which can be more readily and reliably programmed when compared with the conventional e-fuse. The e-fuses and related methods described herein have a silicide link that is designed to improve device performance.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. An electrically programmable fuse (e-fuse) comprising:
a silicon structure;
a pair of silicide contact regions overlying the silicon structure, the pair of silicide contact regions including an anode contact and a cathode contact;
a silicide link overlying the silicon structure and connecting the pair of silicide regions,
the silicide link having a depth less than a depth of each of the pair of silicide contact regions,
wherein the silicide link further has a width less than a width of the pair of silicide contact regions; and
a pair of dummy poly gates overlying the silicon structure each on opposing sides of the silicide link and separated from the silicide link by the silicon structure.

2. The e-fuse of claim 1, wherein the anode contact and the cathode contact each include a conductive material.

3. An electrically programmable fuse (e-fuse) comprising:
a silicon structure;
a pair of silicide contact regions overlying the silicon structure, the pair of silicide contact regions including an anode contact and a cathode contact;
a silicide link overlying the silicon structure and connecting the pair of silicide regions,
the silicide link having a depth less than a depth of each of the pair of silicide contact regions,
wherein the silicide link has an equal length as the pair of silicide contact regions; and
a pair of dummy poly gates overlying the silicon structure each on opposing sides of the silicide link and separated from the silicide link by the silicon structure.

4. The e-fuse of claim 3, wherein the anode contact and the cathode contact each include a conductive material.

5. The e-fuse of claim 1, further comprising at least one shallow trench isolation surrounding the silicon structure.

6. The e-fuse of claim 5, further comprising a silicon dioxide layer under the silicon structure, wherein the pair of dummy poly gates contact a surface of the at least one shallow trench isolation.

7. The e-fuse of claim 6, wherein pair of dummy poly gates includes a pair of substantially equilateral parallel dummy poly gates.

8. The e-fuse of claim 1, wherein each of the pair of dummy poly gates consists of a non-conducting structure including polysilicon.

9. The e-fuse of claim 3, further comprising at least one shallow trench isolation surrounding the silicon structure.

10. The e-fuse of claim 9, further comprising a silicon dioxide layer under the silicon structure, wherein the pair of dummy poly gates contact a surface of the at least one shallow trench isolation.

11. The e-fuse of claim 10, wherein pair of dummy poly gates includes a pair of substantially equilateral parallel dummy poly gates.

12. The e-fuse of claim 3, wherein each of the pair of dummy poly gates consists of a non-conducting structure including polysilicon.

* * * * *